(12) United States Patent
Cheng et al.

(10) Patent No.: US 8,698,175 B2
(45) Date of Patent: Apr. 15, 2014

(54) LIGHT-EMITTING DIODE

(75) Inventors: Wei-Kang Cheng, Taoyuan (TW); Jia-Lin Li, Taoyuan (TW); Shyi-Ming Pan, Taoyuan (TW); Kuo-Chin Huang, Taoyuan (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 154 days.

(21) Appl. No.: 12/547,571

(22) Filed: Aug. 26, 2009

(65) Prior Publication Data

US 2010/0078667 A1    Apr. 1, 2010

(30) Foreign Application Priority Data

Oct. 1, 2008    (TW) .............................. 97137793 A

(51) Int. Cl.
*H01L 33/00*    (2010.01)
(52) U.S. Cl.
USPC ..................................... 257/98; 257/E33.061
(58) Field of Classification Search
USPC ........................................... 257/98, E33.061
See application file for complete search history.

(56) References Cited

U.S. PATENT DOCUMENTS

| 6,468,821 | B2 * | 10/2002 | Maeda et al. | 438/29 |
| 7,271,423 | B2 * | 9/2007 | Hanamoto et al. | 257/98 |
| 7,910,940 | B2 * | 3/2011 | Koike et al. | 257/98 |
| 2004/0207311 | A1 * | 10/2004 | Cheng | 313/499 |
| 2009/0134776 | A1 * | 5/2009 | Ono et al. | 313/503 |
| 2010/0207145 | A1 * | 8/2010 | Yoo | 257/98 |

\* cited by examiner

*Primary Examiner* — Matthew W Such
*Assistant Examiner* — Monica D Harrison
(74) *Attorney, Agent, or Firm* — Ming Chow; Sinorica, LLC

(57) ABSTRACT

The present invention relates to a light-emitting diode (LED). The LED comprises an LED die, one or more metal pads, and a fluorescent layer. The characteristics of the present invention include that the metals pads are left exposed for the convenience of subsequent wiring and packaging processes. In addition, the LED provided by the present invention is a single light-mixing chip, which can be packaged directly without the need of coating fluorescent powders on the packaging glue. Because the fluorescent layer and the packaging glue are not processed simultaneously and are of different materials, the stress problem in the packaged LED can be reduced effectively.

12 Claims, 8 Drawing Sheets

LIGHT-EMITTING DIODE

FIELD OF THE INVENTION

The present invention relates to a light-emitting diode, and particularly to a light-emitting diode capable of mixing light.

BACKGROUND OF THE INVENTION

A light-emitting diode (LED) is a light-emitting device manufactured by semiconductor materials with two electrodes. The light-emitting principle of the LED is that by applying a voltage between the electrodes and supplying an extremely small current, excess energy can be released in the form of light via the recombination process of electrons and holes. The LED is different from an incandescent bulb in that the former is luminescent with advantages of low power consumption, elongated lifetime, no warm-up time, and fast response. In addition, because the LED is small, vibration tolerable, and suitable for mass production, it is easy to be manufactured in an extremely tiny or a matrix form in accordance with application requirements. Currently, the LED is widely applied to indicator and display apparatuses of information, communication, and consumer electronic products, and has become a dispensable and important device in daily lives.

Presently, most LEDs are coated with fluorescent powders in the packages during the packaging process. Thereby, the stress problem will occur in the packages. The present invention provides an LED in a single light-mixing chip, which can be packaged directly, and hence reducing effectively the stress problem as described above.

SUMMARY

An objective of the present invention is to provide a light-emitting diode (LED), which can expose metal pads for the convenience of subsequent wiring and packaging processes.

Another objective of the present invention is to provide an LED, which can provide a single light-mixing chip for direct packaging and reducing the stress problem in the packaged LED.

In order to achieve the objectives described above, the present invention provides an LED, which comprises an LED die, one or more metal pads, and a fluorescent layer. The LED die includes two electrodes. The metal pads are set on the electrodes of the LED die. The fluorescent layer is set on the LED die. Beside, the fluorescent layer does not cover the metal pads completely. Instead, the metal pads are exposed for the convenience of subsequent wiring and packaging processes. The fluorescent layer converts directly partial or all of light with a first wavelength produced by the LED die to light with at least a second wavelength.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 1:
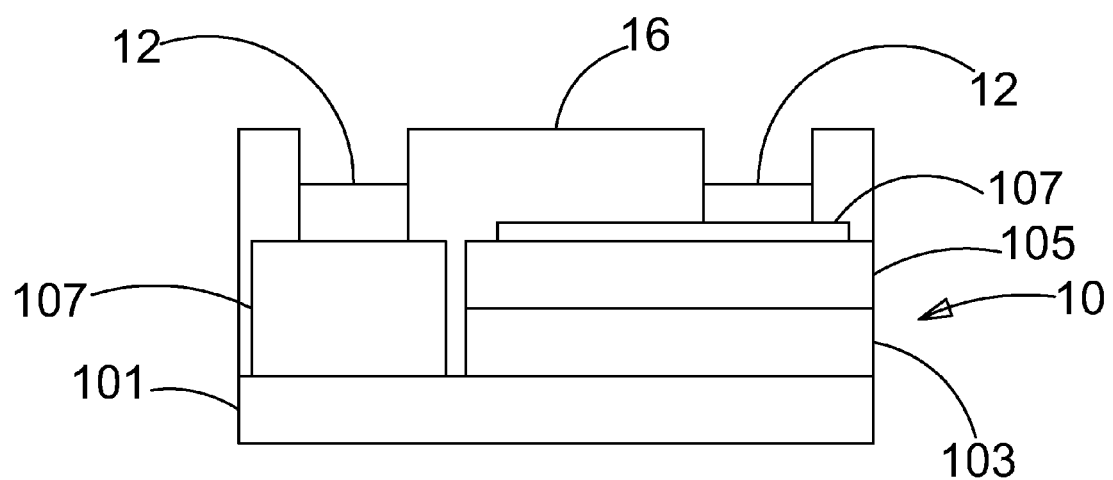
FIG. 1 shows a structural schematic diagram according to a preferred embodiment of the present invention.

FIG. 1 shows a structural schematic diagram according to a preferred embodiment of the present invention. As shown in the figure, the present embodiment provides a light-emitting diode (LED) 1, which comprises an LED die 10, one or more metal pads 12, and a fluorescent layer 16. The LED die 10 includes two electrodes 107. The number of the metal pads 12 according to the present embodiment is two. The two metal pads 12 are set on the two electrodes 107, respectively. The fluorescent layer 16 is set on the LED die 10. In addition, the fluorescent layer 16 does not cover the two metal pads 12 completely. Instead, the metal pads 12 are exposed for the convenience of subsequent wiring and packaging processes. The fluorescent layer 16 converts partial or all of light with a first wavelength produced by the LED die 10 to light with at least a second wavelength for producing light mixing. The LED 1 provided according to the present embodiment is a light-mixing chip, which can be packaged directly without the need of coating fluorescent powders on the package. The thickness of the fluorescent layer 16 is greater than 30 μm. The materials of the fluorescent layer 16 include fluorescent powders and an organic polymer material. The fluorescent powders are chosen from the group comprising red fluorescent powders, green fluorescent powders, blue fluorescent powders, and the combination of the fluorescent powders described above.

The LED die 10 described above further comprises a first semiconductor layer 101, a light-emitting layer 103, and a second semiconductor layer 105. The light-emitting layer 103 is set on the first semiconductor layer 101; the second semiconductor layer 105 is set on the light-emitting layer 103; the metal pads 12 are set on the electrodes 107. When the first semiconductor layer 101 is P-type, the second semiconductor layer 105 is N-type. Alternatively, when the first semiconductor layer 101 is N-type, the second semiconductor layer 105 is P-type.

Figure 2:
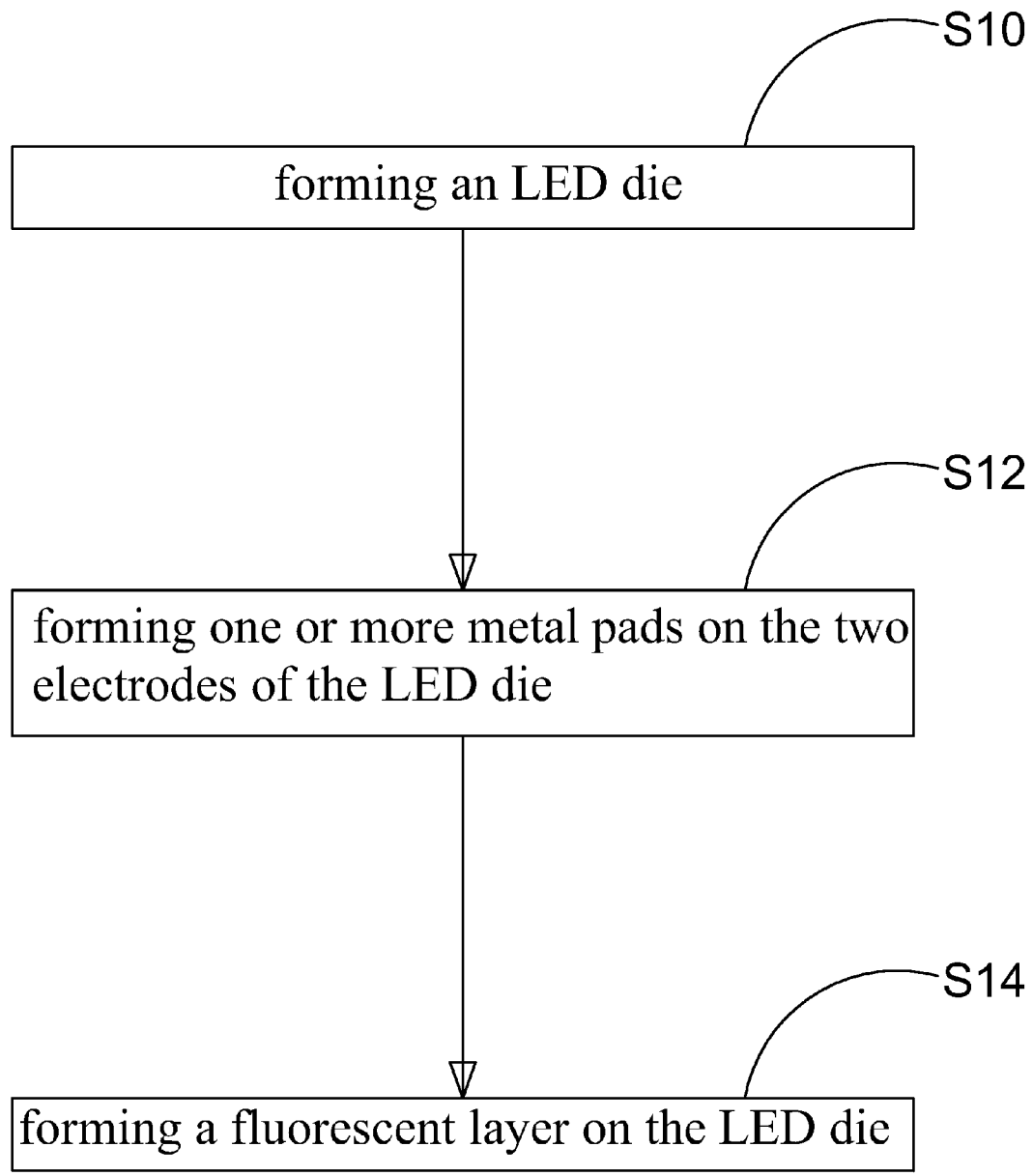
FIG. 2 shows a flowchart according to a preferred embodiment of the present invention.
Figure 3:
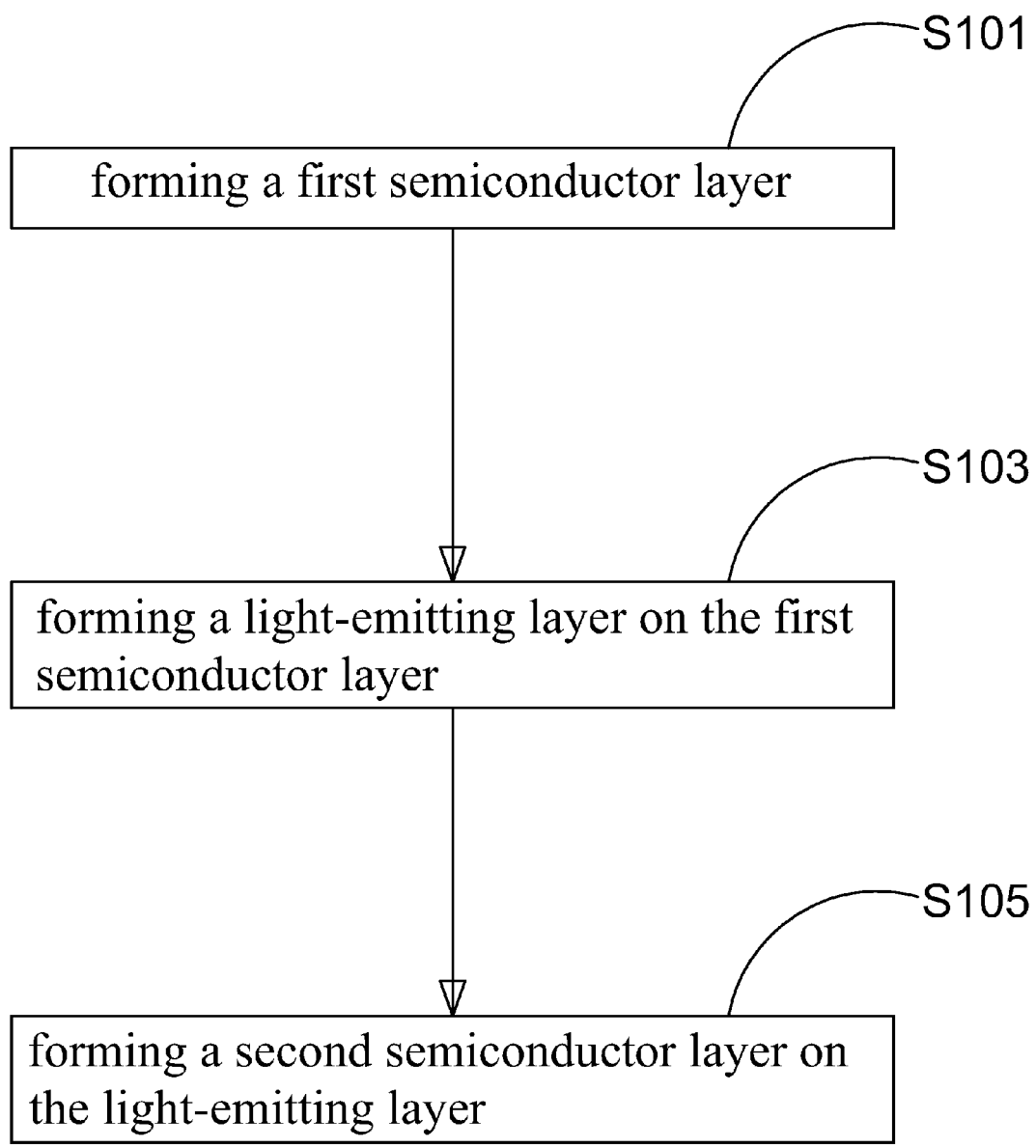
FIG. 3 shows a flowchart for forming an LED die according to a preferred embodiment of the present invention.

FIG. 2 shows a flowchart according to a preferred embodiment of the present invention. As shown in the figure, in contrast to FIG. 1, which shows an LED 1, the present figure shows a method for manufacturing the LED 1. To manufacture the LED 1, the step S10 is first executed for forming an LED die 10, which includes two electrodes 107. Referring together to FIG. 3, the method for forming the LED die 10 comprises the step S101 forming a first semiconductor layer 101; the step S103 forming a light-emitting layer 103 on the first semiconductor layer 101; and finally the step S105 forming a second semiconductor layer 105 on the light-emitting layer 103.

After the step S10 is completed, the step S12 is executed for forming one or more metal pads 12 on the two electrodes 107 of the LED die 10. Next, the step S14 is executed for forming a fluorescent layer 16 on the LED die 10. The fluorescent layer 16 does not cover the metal pads 12 completely. Instead, the metal pads 12 are left exposed for the convenience of subsequent wiring and packaging processes.

For forming the fluorescent layer 16 on the LED die 10, glue dispensing, spaying, or pouring methods are applied. For avoiding the fluorescent layer 16 from covering the metal pads 12 completely during the forming process of the fluorescent layer 16, prior to forming the fluorescent layer 16 on the LED die 10 using the glue dispensing, spaying, or pouring methods, a mask is used on the metal pads 12. The mask can mask the metal pads 12 and expose the location to form the fluorescent layer 16. Besides, the mask is manufactured by lithography or by screen-printing using organic polymer materials such as photoresist. The glue ratio in the glue dispensing, spaying, or pouring methods is controlled according to the photoelectric properties of the LED die 10.

Figure 4A:
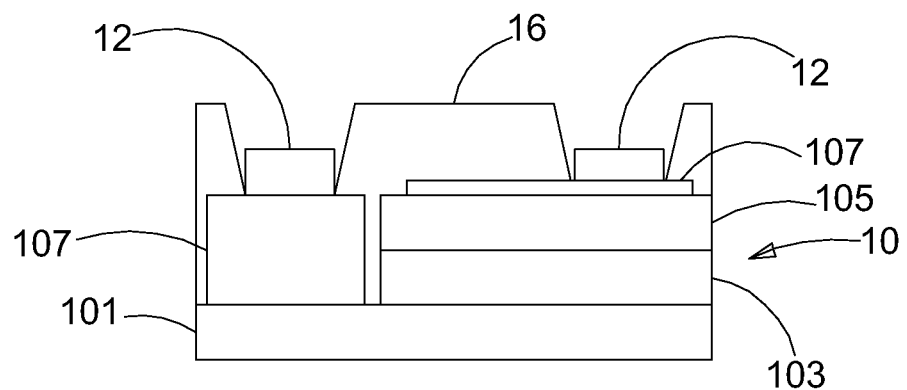
FIG. 4A shows a structural schematic diagram according to another preferred embodiment of the present invention.
Figure 4B:
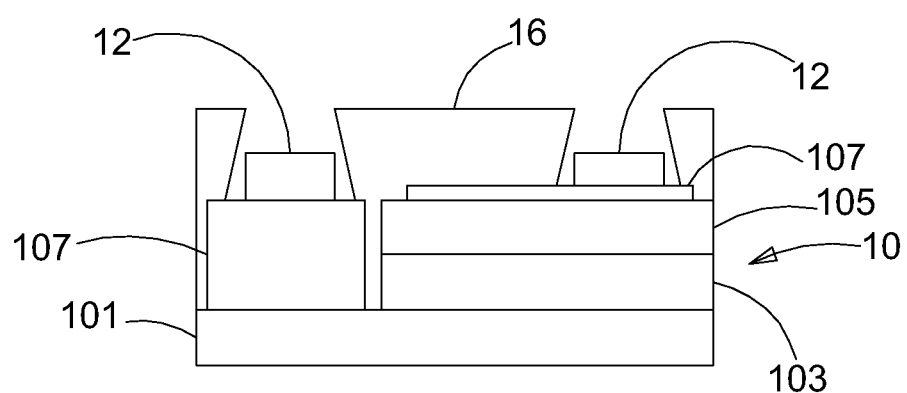
FIG. 4B shows a structural schematic diagram according to another preferred embodiment of the present invention.

FIGS. 4A and 4B show structural schematic diagrams according to other preferred embodiments of the present invention. As shown in the figures, according to the present embodiments, two LED structures are provided. The difference between the present embodiments and the one described above is that, according to the present embodiments, the shape of the fluorescent layer 16 can be changed by etching. The shapes of the fluorescent layer 16 can be trapezoidal or upside-down trapezoidal.

Figure 5:
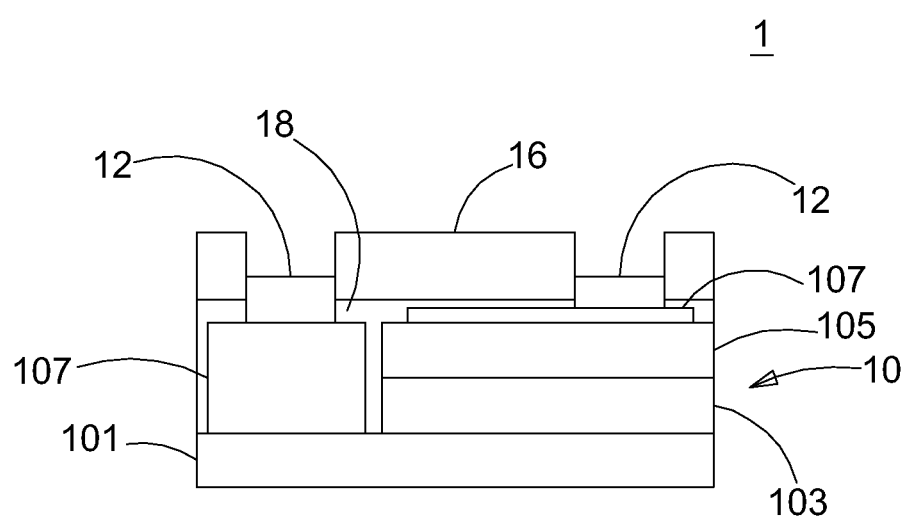
FIG. 5 shows a structural schematic diagram according to another preferred embodiment of the present invention.

FIG. 5 shows a structural schematic diagram according to another preferred embodiment of the present invention. As shown in the figure, the present embodiment provides an LED 1 comprising an LED die 10, one or more metal pads 12, a dielectric layer 18, and a fluorescent layer 16. The LED die 10 includes two electrodes 107. The metal pads are set on the electrodes 107 of the LED die 10. The dielectric layer 18 is set on the LED die 10, and is located on the periphery of the metal pads 12. The fluorescent layer 16 is set on the dielectric layer 18, and is located on the periphery of the metal pads 12. The fluorescent layer 16 converts partial or all of light with a first wavelength produced by the LED die 10 to light with at least a second wavelength for producing light mixing. In addition, the fluorescent layer 16 does not cover the metal pads 12 completely. Instead, the metal pads 12 are exposed for the convenience of subsequent wiring and packaging processes. The LED 1 provided according to the present embodiment is a light-mixing chip, which can be packaged directly without the need of coating fluorescent powders on the package. Besides, the thickness of the fluorescent layer 16 is greater than 30 μm. The LED die 10 further includes a first semiconductor layer 101, a light-emitting layer 103, and a second semiconductor layer 105.

Figure 6:
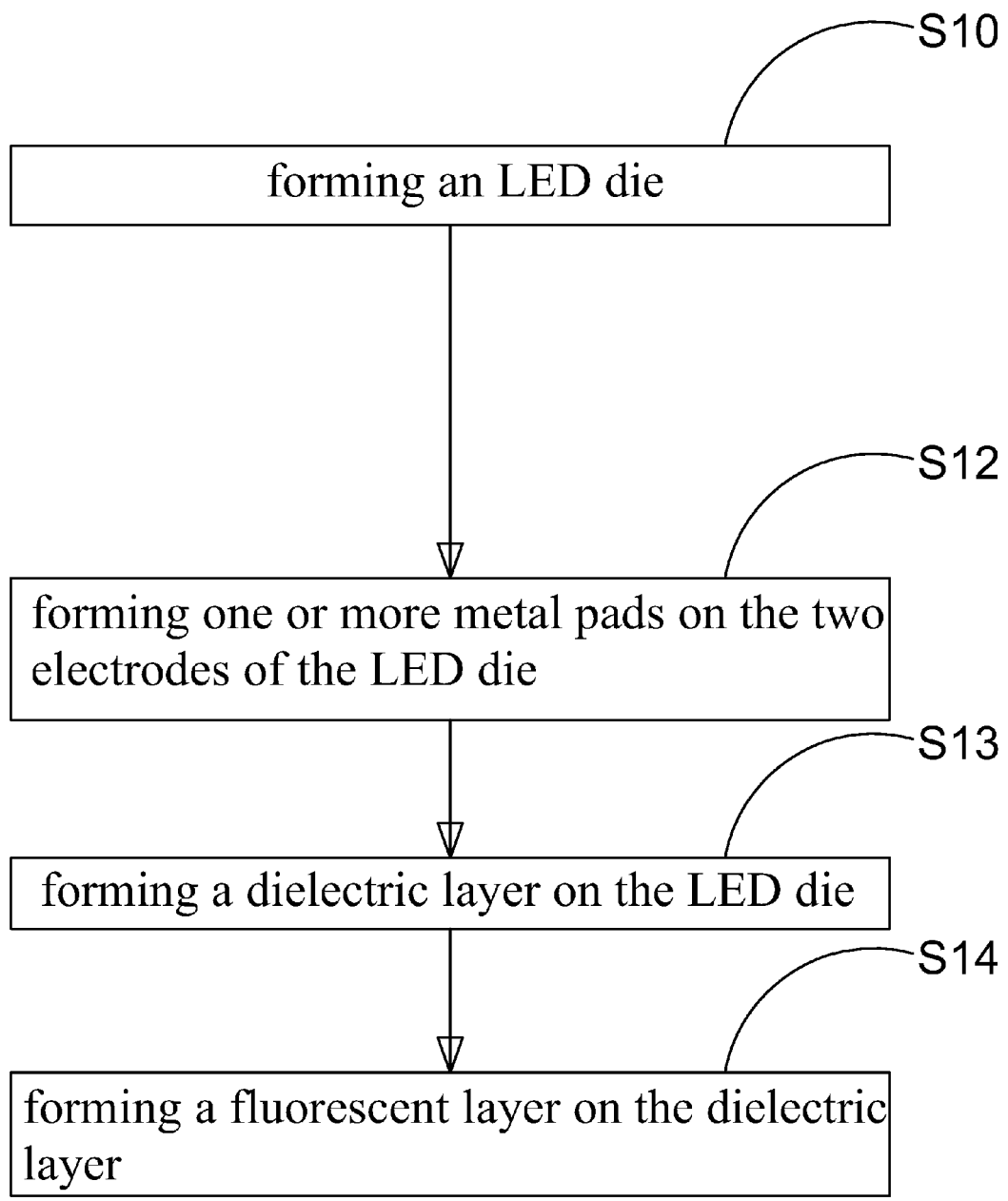
FIG. 6 shows a flowchart according to a preferred embodiment of the present invention.

FIG. 6 shows a flowchart according to a preferred embodiment of the present invention. As shown in the figure, in contrast to FIG. 5, which shows an LED 1, the present figure shows a method for manufacturing the LED 1. To manufacture the LED 1, the step S10 is first executed for forming an LED die 10. Then the step S12 is executed for forming one or more metal pads 12 on the electrodes 107 of the LED die 10. Next, the step S13 is executed for forming a dielectric layer 18 on the LED die 10. Finally, the step S14 is executed for forming a fluorescent layer 16 on the dielectric layer 18. The fluorescent layer 16 does not cover the metal pads 12 completely. Instead, the metal pads 12 are left exposed for the convenience of subsequent wiring and packaging processes.

For forming the fluorescent layer 16 on the LED die 10, glue dispensing, spaying, or pouring methods are applied. For avoiding the fluorescent layer 16 from covering the metal pads 12 completely during the forming process of the fluorescent layer 16, prior to forming the fluorescent layer 16 on the LED die 10 using the glue dispensing, spaying, or pouring methods, a mask is used on the metal pads 12. The mask can mask the metal pads 12 and expose the location to form the fluorescent layer 16. Besides, the mask is manufactured by lithography or by screen-printing using organic polymer materials such as photoresist.

Figure 7:
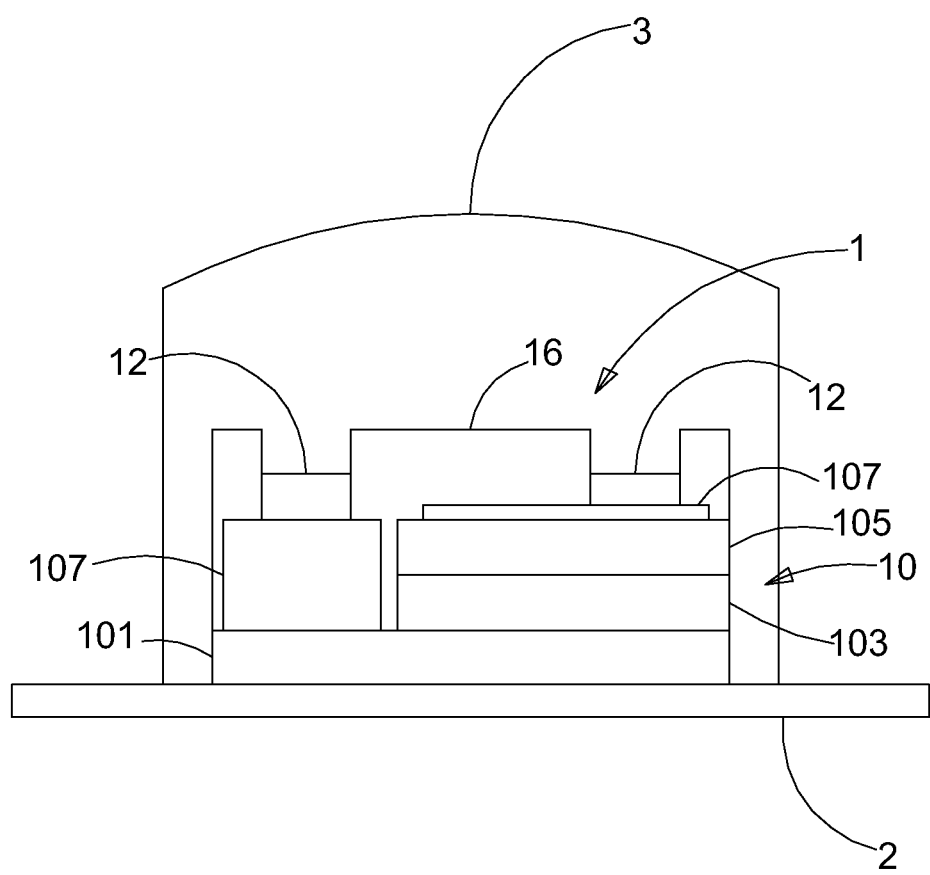
FIG. 7 shows a structural schematic diagram according to another preferred embodiment of the present invention.

FIG. 7 shows a structural schematic diagram according to another preferred embodiment of the present invention. As shown in the figure, for packaging the LED 1 provided in FIG. 1, the LED 1 is set on a carrier 2. Then, the metal pads 12 are connected by wiring. Finally, use packaging glue 3 to cover the carrier 2 and the LED 1. The material of the packaging glue 3 is organic polymer, and fluorescent powders can be further contained therein. The organic polymer material of the packaging glue 3 differs from the organic polymer material of the fluorescent layer described in FIG. 1. In addition, the packaging glue 3 and fluorescent layer 16 are not processed simultaneously. The baking time of the two is also different, which can reduce the stress problem effectively produced in the package of the LED 1. Moreover, the packaging structure according to present embodiment can be applied to the embodiment of FIG. 5.

Figure 8:
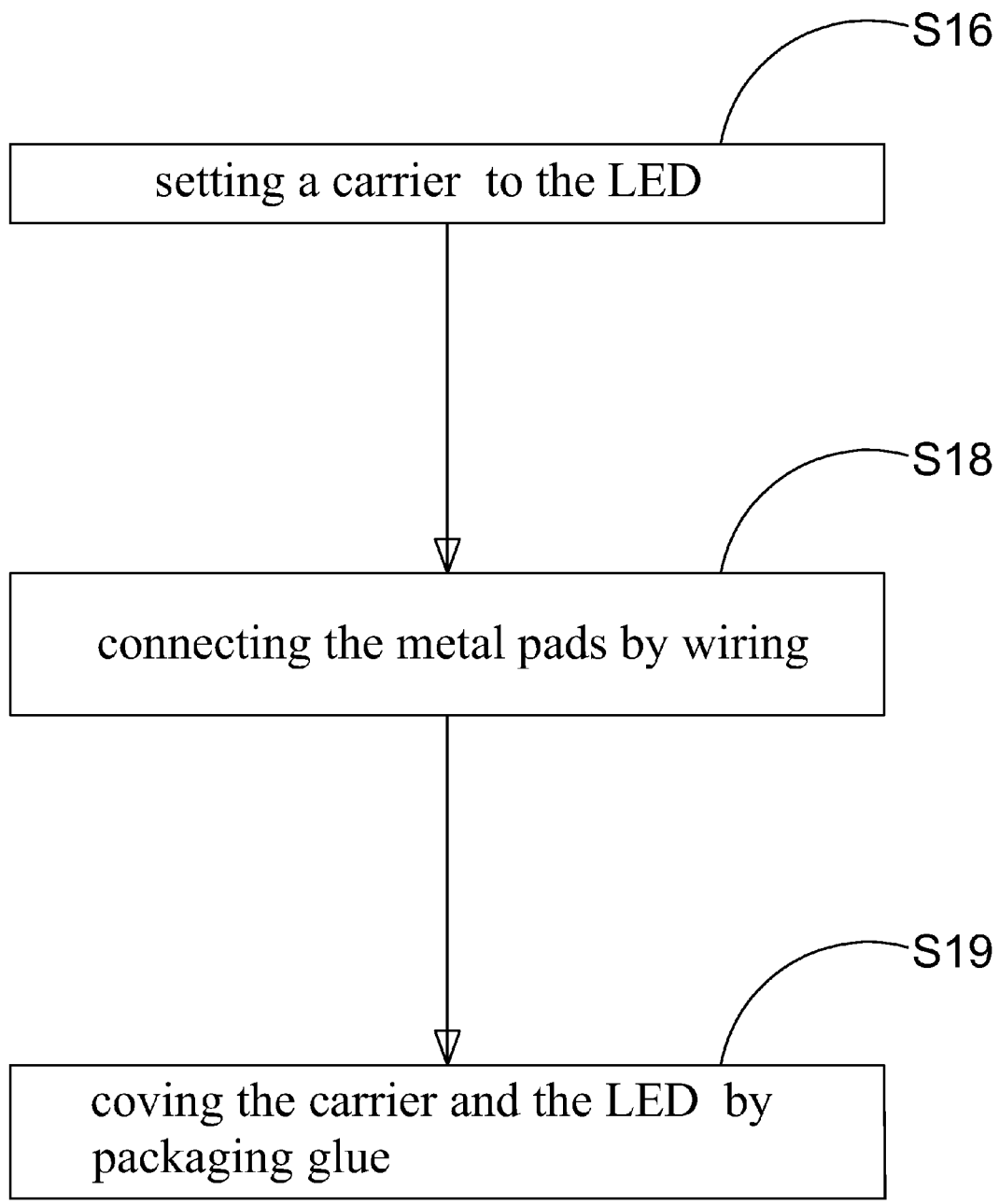
FIG. 8 shows a flowchart according to a preferred embodiment of the present invention.

FIG. 8 shows a flowchart according to a preferred embodiment of the present invention. As shown in the figure, for packaging the LED 1 provided in FIG. 1, the step S16 is first executed for setting a carrier 2 to the LED 1 and opposite to the fluorescent layer 16. Then the step S18 is executed for connecting the metal pads 12 by wiring. Finally, the step S19 is executed for coving the carrier 2 and the LED 1 by packaging glue 3. The packaging method provided according to the present embodiment can be applied to the LED1 provided in FIG. 5, and will not be described in detail.

It is known from above that the present invention provides an LED and a method for manufacturing the same. The characteristics of the present invention include that the metals pads are left exposed for the convenience of subsequent wiring and packaging processes. In addition, the LED provided by the present invention is a single light-mixing chip, which can be packaged directly without the need of coating fluorescent powders on the packaging glue. Because the fluorescent layer and the packaging glue are not processed simultaneously and are of different materials, the stress problem in the packaged LED can be reduced effectively.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A light-emitting diode (LED), which is a positive light-emitting type light emitting diode, comprising:
   an LED die;
   at least two metal pads, set on said LED die, wherein the top surfaces of said metal pads set on the same plane essentially;
   a fluorescent layer, set on a surface of said LED die and said metal pads;
   said fluorescent layer located on the periphery of said metal pads and not covering said metal pads;
   said metal pads being exposed;
   said LED die comprising a first semiconductor layer; a second semiconductor layer, a light-emitting layer, a first electrode and a second electrode;
   said light-emitting layer set on said first semiconductor layer;

said second semiconductor layer set on said light-emitting layer;

said second electrode being completely on top of said second semiconductor layer;

said first electrode being completely on top of said first semiconductor layer;

at least one of said metal pads set on said first electrode, and at least one of said metal pads set on said second electrode;

the thickness of the fluorescent layer is greater than 30 μm; and at least part of light with a first wavelength produced by the LED die is converted to light with at least a second wavelength by the fluorescent layer.

2. The LED of claim 1, wherein the materials of the fluorescent layer include fluorescent powders and an organic polymer material.

3. The LED of claim 2, wherein the materials of said fluorescent powders are chosen from the group comprising red fluorescent powders, green fluorescent powders, blue fluorescent powders, and the combination of the fluorescent powders described above.

4. The LED of claim 1, wherein said first semiconductor layer is N-type, and said second semiconductor is P-type.

5. The LED of claim 1, wherein said first semiconductor layer is P-type, and said second semiconductor is N-type.

6. The LED of claim 1, and further comprising a carrier, set on a side of the LED, and faced to the fluorescent layer.

7. The LED of claim 6, and further comprising a packaging glue, set on the carrier, and covers the LED without coating of fluorescent powders, the metal pads and the fluorescent layer.

8. The LED of claim 7, wherein the material of the packaging glue is organic polymer.

9. The LED of claim 7, wherein the material of the packaging glue further comprising fluorescent powders.

10. The LED of claim 1, and further comprising a dielectric layer, set between said LED die and said fluorescent layer.

11. The LED of claim 1, wherein the shape of said fluorescent layer is trapezoidal or upside-down trapezoidal.

12. The LED of claim 1, wherein a periphery of said fluorescent layer is aligned to a periphery of said LED die.

* * * * *